United States Patent
Boutaud et al.

(10) Patent No.: US 6,624,682 B1
(45) Date of Patent: Sep. 23, 2003

(54) METHOD AND AN APPARATUS TO ACTIVELY SINK CURRENT IN AN INTEGRATED CIRCUIT WITH A FLOATING I/O SUPPLY VOLTAGE

(75) Inventors: Frederic Boutaud, Belmont, MA (US); Sean M. FitzPatrick, Westford, MA (US); Paul D. Krivacek, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/267,563

(22) Filed: Oct. 9, 2002

(51) Int. Cl.[7] ................................................ H03K 5/08
(52) U.S. Cl. ...................................... 327/310; 327/376
(58) Field of Search ................................ 327/185, 376, 327/112, 198, 309, 312, 316–319, 321, 322, 323, 332, 333; 326/56–58

(56) References Cited

U.S. PATENT DOCUMENTS

| | | | |
|---|---|---|---|
| 4,745,305 A | 5/1988 | Crafts | .......................... 326/86 |
| 5,973,530 A | * 10/1999 | Morris et al. | ................ 327/210 |
| 6,147,510 A | * 11/2000 | Pappert | ........................ 326/56 |
| 6,300,800 B1 | * 10/2001 | Schmitt et al. | ................ 326/86 |
| 6,373,282 B1 | * 4/2002 | Drapkin et al. | ................ 326/68 |
| 6,400,546 B1 | * 6/2002 | Drapkin et al. | ............. 361/111 |

* cited by examiner

Primary Examiner—My-Trang Nu Ton
(74) Attorney, Agent, or Firm—Samuels, Gauthier & Stevens, LLP

(57) ABSTRACT

Described is an apparatus and a method for pulling an integrated circuit I/O pad to a known state and providing a current path between the pad and a source of potential during periods when an I/O voltage is likely to be floating. At least one I/O transistor coupled between the I/O pad and a source of potential is provided. Also provided is a combinatorial circuit connected to the I/O transistor to turn on the I/O transistor during periods that the I/O voltage is likely to be floating.

12 Claims, 1 Drawing Sheet

METHOD AND AN APPARATUS TO ACTIVELY SINK CURRENT IN AN INTEGRATED CIRCUIT WITH A FLOATING I/O SUPPLY VOLTAGE

BACKGROUND OF THE INVENTION

The invention relates to the field of input/output (I/O) circuitry for an integrated circuit (IC), and in particular to I/O circuitry for an IC that provides an adequate current path between an I/O pad and a source of potential, and guarantees a known state on the I/O pad, during times when the I/O voltage is floating.

Many ICs have I/O interface circuitry and pads that are supplied an I/O voltage, $V_{I/O}$, while the core logic it interfaces to is supplied with a core voltage, $V_{core}$. When such ICs are used in certain applications, the pad of the IC is required to be capable of sinking a specified amount of current while the I/O supply voltage is floating. Also during these times, it is advantageous to have a known state needed on the pad. Since the pad's driving and protection circuitry are controlled by the I/O voltage, there is no guaranteed that these circuits will provide an adequate current path between the pad and a source of potential (e.g., ground) when the I/O voltage is floating.

Thus, it would be advantageous to have a means of providing an adequate current path and known state for an IC's I/O pad during periods when the I/O voltage is floating.

SUMMARY OF THE INVENTION

In one aspect of the present invention, an integrated circuit is provided. The integrated circuit has an I/O pad and at least one I/O transistor coupled between the I/O pad and a source of potential. A combinatorial circuit is connected to the I/O transistor's gate to turn on the transistor during periods that an I/O voltage is likely to be floating. Turning the I/O transistor on pulls the pad to a known state and provides a current path between the pad and the source of potential.

In a particular embodiment, the combinatorial circuit has a first input coupled to an output signal of the integrated circuit and a second input coupled to an enable signal. A particular state of the output signal and the enable signal causes the combinatorial circuit to output a signal that turns the I/O transistor on.

Another aspect of the present invention provides a method of pulling an I/O pad to a known state and providing a current path between the pad and a source of potential during periods when an I/O voltage is likely to be floating. At least one I/O transistor coupled between the I/O pad and a source of potential is provided. Also provided is a combinatorial circuit connected to the I/O transistor and an enable signal such that the combinatorial circuit turns on the transistor in response to the enable signal being in a first state. The enable signal is switched into a first state during periods when an I/O voltage is likely to be floating.

DETAILED DESCRIPTION OF THE INVENTION

Figure 1:
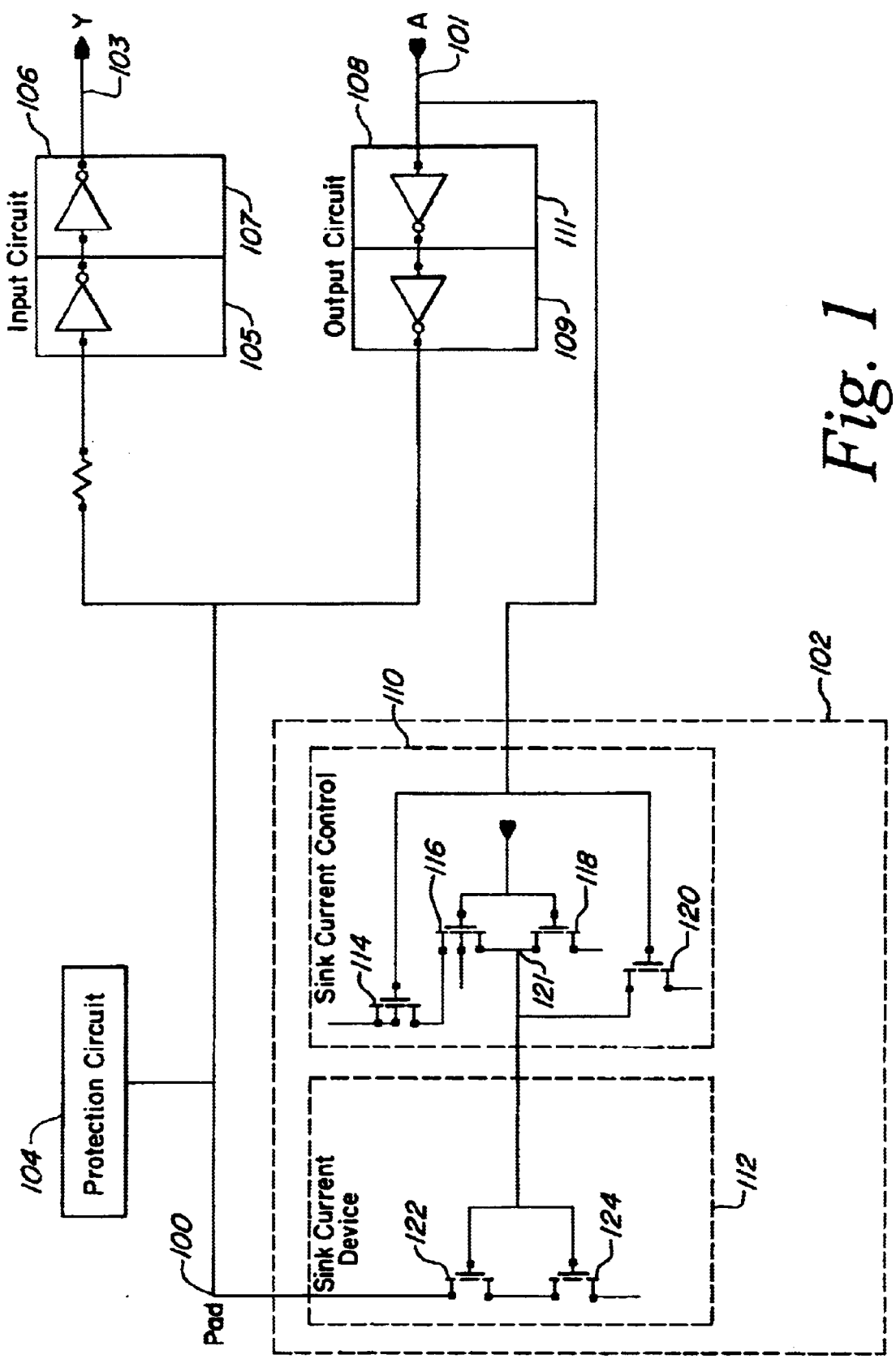
FIG. 1 illustrates an IC pad with supporting circuitry according to the present invention.

FIG. 1 illustrates an IC pad 100 with supporting circuitry 102 according to the present invention. Supporting circuitry 102 provides an adequate current path and known state for an IC's I/O pad during periods when the I/O voltage is floating. Such periods occur during, for example, initialization, reset, or recovery from a power saving mode in which the I/O voltage is shut off.

Generally, IC pad 100 has output circuitry 108 associated with it to couple output signals from the core logic (not shown) to pad 100. Output signals from the core logic are output on an output line 101. Output circuitry 108 comprises a level shifter, formed from two serially connected inverters 109 and 111, to shift output signals from the core voltage domain to the I/O voltage domain. The I/O voltage is 3.3V, while the core voltage is 1.8V, for example. IC pad may also have input circuitry 106 associated with it for delivering input signals from pad 100 to the core logic via an input line 103. Input circuitry 106 similarly comprises a level shifter, formed from two serially connected inverters 105 and 107, to shift input signals from the I/O voltage domain to the core voltage domain. Protection circuitry 104 may also be associated with pad 100 to protect against electrostatic discharge (ESD), and is powered by the I/O voltage.

As described, IC pad 100 also has supporting circuitry 102 associated with it to provide an adequate current path and known state for pad 100 during periods when the I/O voltage is floating. Circuitry 102 comprises one or more I/O transistors 112 that are controlled by a combinatorial circuit 110. In the embodiment shown, I/O transistors 112 are pull-down transistors. Combinatorial circuitry 110 is powered by the core voltage and is designed to turn on I/O transistors 112 during periods that the I/O voltage is likely to be floating. Combinatorial circuit 110 can exist in the core area or may be integrated into pad 100.

Transistors 112 comprise two n channel transistors 122 and 124 serially connected with the drain of transistor 122 connected to the source of transistor 124. The source of transistor 122 is connected to pad 100. The drain of transistor 124 is connected to a potential $V_{SS}$, which is ground, for example. The gates of transistors 122 and 124 are tied in parallel to the output 121 of combinatorial circuit 110. Two transistors have been used in the embodiment shown to provide a cascoded configuration, however, one or more serially connected transistors can be used. Turning transistors 112 on provides a current path from pad 100 to ground and pulls pad 100 to a low state (i.e., places pad 100 into a known state).

Combinatorial circuit 110 comprises an inverter formed from p channel transistor 116 and n channel transistor 118 series connected with their sources connected together, forming output node 121. Their input gates are connected in parallel to an enable signal nOE. The drain electrode of n channel transistor 118 is connected to $V_{SS}$. The drain of p channel transistor 116 is connected to the source of a p channel disable transistor 114. The drain of disable transistor 114 is connected to a potential, $V_{DD}$ (i.e., the core voltage, $V_{core}$). In addition, a p channel pull-down transistor 120 has its source connected to output node 121, and its drain connected to the potential $V_{SS}$. The gates of the disable transistor 114 and pull-down transistor 120 are tied in parallel to the output signal A from the core logic.

A particular state of the output signal A and the enable signal nOE causes the combinatorial circuit 110 to output a signal that turns transistors 112 on, thereby pulling pad 100 to a known state and providing a current path between the pad and the source of potential. During periods when the I/O voltage is likely to be floating, such as on reset or initialization, the output A of the core logic will be driven low. The low state on the output A causes p channel transistor 114 to turn on, connected the drain of p channel transistor 116 to $V_{DD}$. The low state on output A also causes n channel transistor 120 to turn off, disconnecting output node 121 from $V_{SS}$. At the same time, nOE is driven low. This causes output node 121 to go high, turning on transistors 112 so as to provide an adequate current path and known state for pad 100.

At times when the output signal A is not low (i.e., it is high), transistor 114 turns off, disconnecting the drain of transistor 116 from $V_{DD}$, thereby disabling the inverter formed by transistors 116 and 118. Transistor 120 is turned on at this time, pulling output 121 low, thereby causing transistors 112 to be in the off state. Also, during times when the I/O voltage is not likely to be floating, nOE is driven high. This causes output 121 to go low, thereby causing transistors 112 to be in the off state. Thus, even when output A is low during periods when the I/O voltage is not floating, transistors 112 are disabled.

Although the present invention has been shown and described with respect to several preferred embodiments thereof, various changes, omissions and additions to the form and detail thereof, may be made therein, without departing from the spirit and scope of the invention. For example, while the present invention has been described primarily in relation to an IC having I/O pads that interface to an off-chip system, the present invention is not limited thereto. Instead, the I/O circuitry according to the present invention could be interfacing between several subsystems integrated onto a single IC, rather than interfacing between the off-chip world and the on-chip logic. Thus, the term I/O pad should be understood to generally encompass the interface point of the I/O circuitry, even if a "pad" is not specifically there.

What is claimed is:

1. An integrated circuit comprising:
    an I/O pad;
    at least one I/O transistor coupled between the I/O pad and a source of potential;
    a combinatorial circuit connected to the I/O transistor's to turn on the I/O transistor during periods that an I/O voltage is likely to be floating; and
    wherein turning the I/O transistor on pulls the pad to a known state and provides a current path between the pad and the source of potential.
2. The integrated circuit of claim 1 wherein the at least one transistor comprises two transistors in a cascoded configuration.
3. The integrated circuit of claim 1 wherein the combinatorial circuit comprises:
    an inverter with an input and an output, the inverter output connected to the I/O transistor's gate and the inverter input connected to an enable signal, wherein the enable signal in a first state results in an inverter output that causes the I/O transistor to turn on;
    a disable transistor connected to the inverter and an output signal of the integrated circuit such that when the output signal is in a first state the inverter is enabled and when the output signal is in a second state the inverter is disabled; and
    a transistor connected to the inverter output and the output signal of the integrated circuit such that when the output signal is in a first state the transistor is turned off and when the output signal is in a second state the transistor is turned on, forcing the inverter output to a known state, wherein the known state causes the I/O transistor to turn off.
4. An integrated circuit comprising:
    an I/O pad;
    at least one I/O transistor coupled between the I/O pad and a source of potential;
    means for turning on the I/O transistor during periods that an I/O voltage is likely to be floating; and
    wherein turning the I/O transistor on pulls the pad to a known state and provides a current path between the pad and the source of potential.
5. The integrated circuit of claim 4 wherein the at least one transistor comprises two transistors in a cascoded configuration.
6. An integrated circuit comprising:
    an I/O pad;
    a combinatorial circuit having a first input coupled to an output signal of the integrated circuit and a second input coupled to an enable signal;
    at least one I/O transistor having a first terminal coupled to the I/O pad, a second terminal coupled to a source of potential, and a third terminal coupled to an output of the combinatorial circuit; and
    wherein a particular state of the output signal and the enable signal causes the combinatorial circuit to output a signal that turns the I/O transistor on, thereby pulling the pad to a known state and providing a current path between the pad and the source of potential.
7. The integrated circuit of claim 6 wherein the at least one transistor comprises two transistors in a cascoded configuration.
8. The integrated circuit of claim 6 wherein the combinatorial circuit comprises:
    an inverter with an input and an output, the inverter output connected to the output of the combinatorial circuit and the inverter input connected to the second input, wherein the enable signal in a first state results in an inverter output that causes the I/O transistor to turn on;
    a disable transistor connected to the inverter and first input such that when the output signal is in a first state the inverter is enabled and when the output signal is in a second state the inverter is disabled; and
    a transistor connected to the inverter output and first input such that when the output signal is in a first state the transistor is turned off and when the output signal is in a second state the transistor is turned on, forcing the inverter output to a known state, wherein the known state causes the I/O transistor to turn off.
9. The integrated circuit of claim 6 wherein the source of potential is ground.
10. In an integrated circuit, a method of pulling an I/O pad to a known state and providing a current path between the pad and a source of potential during periods when an I/O voltage is likely to be floating, the method comprising:
    providing at least one I/O transistor coupled between the I/O pad and a source of potential;
    providing a combinatorial circuit connected to the I/O transistor and an enable signal such that the combinatorial circuit turns on the transistor in response to the enable signal being in a first state; and
    switching the enable signal into a first state during periods when an I/O voltage is likely to be floating, thereby pulling the pad to a known state and providing a current path between the pad and the source of potential.
11. The integrated circuit of claim 10 wherein the at least one transistor comprises two transistors in a cascoded configuration.

12. The integrated circuit of claim 10 wherein the combinatorial circuit comprises:

an inverter with an input and an output, the inverter output connected to the I/O transistor's gate and the inverter input connected to the enable signal, wherein the enable signal in a first state results in an inverter output that causes the I/O transistor to turn on;

a disable transistor connected to the inverter and an output signal of the integrated circuit such that when the output signal is in a first state the inverter is enabled and when the output signal is in a second state the inverter is disabled; and a transistor connected to the inverter output and the output signal of the integrated circuit such that when the output signal is in a first state the transistor is turned off and when the output signal is in a second state the transistor is turned on, forcing the inverter output to a known state, wherein the known state causes the I/O transistor to turn off.

\* \* \* \* \*